United States Patent
Fish et al.

(10) Patent No.: US 7,427,833 B2
(45) Date of Patent: Sep. 23, 2008

(54) ACTIVE MATRIX PIXEL DRIVE CIRCUIT FOR OLED DISPLAY

(75) Inventors: David A. Fish, Haywards Heath (GB); Steven C. Deane, Redhill (GB); Jason R. Hector, Redhill (GB); Ian D. French, Hove (GB)

(73) Assignee: TPO Displays Corp. (TW)

( * ) Notice: Subject to any disclaimer, the term of this patent is extended or adjusted under 35 U.S.C. 154(b) by 145 days.

(21) Appl. No.: 10/559,054

(22) PCT Filed: May 28, 2004

(86) PCT No.: PCT/IB2004/001863

§ 371 (c)(1),
(2), (4) Date: Dec. 1, 2005

(87) PCT Pub. No.: WO2004/109640

PCT Pub. Date: Dec. 16, 2004

(65) Prior Publication Data

US 2006/0132051 A1    Jun. 22, 2006

(30) Foreign Application Priority Data

Jun. 6, 2003    (GB) .................................. 0313041.6

(51) Int. Cl.
*H01J 1/62*    (2006.01)
*H05B 33/00*    (2006.01)
*G09G 3/10*    (2006.01)

(52) U.S. Cl. .................... 313/506; 313/503; 257/40

(58) Field of Classification Search ............... 313/506, 313/509, 503
See application file for complete search history.

(56) References Cited

U.S. PATENT DOCUMENTS

| 6,611,108 B2 * | 8/2003 | Kimura ............... 315/169.3 |
| 6,897,480 B2 * | 5/2005 | Park ............................ 257/59 |
| 2003/0137255 A1 | 7/2003 | Park et al. |

FOREIGN PATENT DOCUMENTS

| EP | 0717446 A2 | 6/1996 |
| WO | WO9636959 A2 | 11/1996 |

* cited by examiner

*Primary Examiner*—Mariceli Santiago
*Assistant Examiner*—Anthony T Perry
(74) *Attorney, Agent, or Firm*—Raymond J. Ho; Venable LLP

(57) ABSTRACT

A display device has a plurality of pixels, each having a current-driven display element coupled between a first conductive layer and a second conductive layer, the second conductive layer being coupled to a current supply via a switchable device having a thin film component on a first area of a substrate. Each pixel has a first capacitive device having a first capacitor plate on a second area of the substrate, the first capacitor plate conductively coupled to the thin film component, a second capacitor plate and a first insulating layer between the first capacitor plate and the second capacitor plate. On top of the first capacitive device is a second capacitive device sharing the second capacitor plate, the second capacitive device including a third capacitor plate sharing the second conductive layer, and a second insulating layer between the second capacitor plate and the third capacitor plate.

8 Claims, 3 Drawing Sheets

ACTIVE MATRIX PIXEL DRIVE CIRCUIT FOR OLED DISPLAY

The present invention relates to a display device comprising a plurality of pixels carried on a substrate surface area, each pixel comprising a current-driven display element coupled between a first conductive layer and an second conductive layer, the second conductive layer being coupled to a current supply via a switchable device having a thin film component on a first part of the substrate surface area.

Display devices having current-driven electroluminescent display elements like light emitting diodes (LEDs) based on row III-V semiconductor materials, organic light emitting diodes (OLEDs) or polymer light emitting diodes (poly-LEDs) attract a lot of attention, because the display characteristics of such devices have the potential to outperform more established voltage-driven display devices like liquid crystal displays (LCDs) in terms of contrast and brightness performance.

The pixels of for instance OLED and poly-LED display devices typically include a display element coupled between a first conductive layer and a second conductive layer, with the second conductive layer being coupled to a current supply via by a switchable device. Depending on the channel type of the switchable device, the first conductive layer acts as a cathode and the second conductive layer acts as an anode or vice versa. When enabled, the switchable device works as a current source, with a gate voltage applied to the switchable device, e.g., a transistor, defining the actual current output of the switchable device, and with the actual current output defining the brightness level of the display element.

FIG. 1 shows a known pixel circuit for an active matrix addressed electroluminescent display device. The display device comprises a panel having a row and column matrix array of regularly-spaced pixels, denoted by the blocks 1 and comprising electroluminescent display elements 2 together with associated switching means, located at the intersections between crossing sets of row (selection) and column (data) address conductors 4 and 6. Only a few pixels are shown in FIG. 1 for simplicity.

In practice there may be several hundred rows and columns of pixels. The pixels 1 are addressed via the sets of row and column address conductors by a peripheral drive circuit comprising a row, scanning, driver circuit 8 and a column, data, driver circuit 9 connected to the ends of the respective sets of conductors.

The electroluminescent display element 2 comprises an organic light emitting diode. The display elements of the array are carried together with the associated active matrix circuitry on one side of an insulating support, i.e., a substrate. Either the cathodes or the anodes of the display elements are formed of transparent conductive material. The support is of transparent material such as glass and the electrodes of the display elements 2 closest to the substrate may consist of a transparent conductive material such as ITO so that light generated by the electroluminescent layer is transmitted through these electrodes and the support so as to be visible to a viewer at the other side of the support. Typically, the thickness of the organic electroluminescent material layer is between 100 nm and 200 nm.

Typical examples of suitable organic electroluminescent materials which can be used for the elements 2 are known and described in EP-A-0 717446. Conjugated polymer materials as described in WO96/36959 can also be used.

The aforementioned switchable device in a pixel 1 of the display device shown in FIG. 1 may be realized by means of a low-temperature polysilicon (LTPS) thin film transistor (TFT). LTPS TFTs have the advantage that the threshold voltage ($V_{th}$) of the individual TFTs is relatively stable during the lifetime of the display device. Unfortunately, the absolute values of the threshold voltages of the individual TFTs can vary substantially, because these values are a function of the polysilicon grain distribution over the display device substrate. Such variations between individual TFT threshold voltages are highly unwanted, because they can lead to observable deviations from the intended light emission intensity from the current-driven display element. Since the amount of output current (I) relates directly to the square of the difference between the gate-source voltage ($V_{gs}$) of the TFT and $V_{th}$, ($I \sim (V_{gs} - V_{th})^2$), it will be understood that deviations from the intended value of $V_{th}$ will lead to a deviation from the intended value of the actual output current of the TFT and to the aforementioned artefacts in the output of the display element.

Alternatively, amorphous silicon thin film transistors (a-Si TFTs) can be used as switchable devices. The use of a-Si TFTs is attractive, not only because they can be produced cheaply, but more importantly because the threshold voltages of the individual a-Si TFTs show little variation, thus avoiding the aforementioned disadvantage of LTPs-TFTs. Unfortunately, a-Si TFTs suffer from an increase in threshold voltage ($V_{th}$) resulting from the introduction of defects, such as pinholes caused by hot carrier injection, in the amorphous silicon during operation of the a-Si TFT. Such ageing effects, which are likely to vary from one individual a-Si TFT to another due to different usage intensity, can also cause the aforementioned display artefacts.

There are several ways to compensate for the $V_{th}$ deviation or deterioration of a switchable device like a LTPS-TFT or an a-Si TFT. A possible solution is disclosed in non-prepublished British patent application 0301659.0 and is shown in FIG. 2. The pixel of the display device shown in FIG. 2 comprises a current-driven display element 2 coupled between a current supply line 26 and a ground line 28. The display element 2 is coupled to the current supply line 26 via a drive transistor 12. The gate of the drive transistor 12 is coupled to its own source via a series connection of a first capacitive device 32 and a second capacitive device 34. Capacitive devices 32 and 34 can be programmed using further transistors 13-16 to respectively store the actual threshold voltage of the drive transistor 12 and a data voltage representing the intended brightness level of the display element 2. This results in the actual gate voltage applied to the gate of the drive transistor 12 being corrected with the actual threshold voltage of the drive transistor 12. Consequently, the current applied to the display element 2 is largely insensitive to changes in the threshold voltage of the drive transistor 12.

Another solution to compensate for the ageing effects in a-Si TFTs is disclosed in non-prepublished British patent application 0307475.4, which discloses a display device having a pixel as shown in FIG. 3. Current-driven display element 2 is coupled between current supply line 26 and ground line 28 via a drive transistor 12, with a series arrangement of first capacitive device 32 and second capacitive device 34 coupled between the gate and source of the drive transistor 12. First capacitive device 32 is provided with the data voltage for the display element 2 via transistor 13 and data line 24. Transistors 13 and 16 are required for programming capacitive devices 32 and 34 to their intended states. The display device further comprises a dummy pixel (not shown), which is provided with a data signal representing an average of the plurality of data signals that are presented to the plurality of pixels in the display device. The ageing of the drive transistor of the dummy pixel can be considered an average of the ageing of the various drive transistors 12 in the pixels of the display device. The $V_{th}$ of the drive transistor in the dummy pixel is measured and provided to the second capacitive device 34 via dummy data signal line 60 and transistor 62. Consequently, the gate voltage applied to the gate of the drive transistor 12 includes a compensation based on an averaged $V_{th}$ deterioration.

The performance of pixels such as the circuits shown in FIGS. 2 and 3, in which capacitive devices are used to memorize physical properties such as a threshold voltage of a switchable device like a drive transistor, can be compromised by the presence of stray, or parasitic, capacitances between the capacitive devices and other parts of the pixels. For instance, the circuit shown in FIG. 2 can have a significant parasitic capacitance 42 between the gate of transistor 14 and the first capacitive device 32. The parasitic capacitance 42 can have a disruptive effect on the charge stored on the first capacitive device 32, which can corrupt the data stored on the first capacitive device 32 if the disruptive effect is large enough.

Another significant parasitic capacitance that can corrupt the data stored on the first capacitive device 32 is the parasitic capacitance 52 between the drain contact of drive transistor 12 and the first capacitive device 32. The parasitic capacitances 42 and 52 are especially unwanted when the threshold voltage of the drive transistor 12 is stored on the first capacitive device 32. During the threshold voltage measurement of the drive transistor 12, node A is at the supply voltage level, whereas node B is at the threshold voltage level. Upon completion of the measurement, transistors 14 and 15 are switched off, leading to node B becoming defined by the data on the data column 24. Consequently, node A must exhibit a voltage value of the threshold voltage above this data voltage. In other words, the voltage on node A is moved from the supply voltage to a voltage level defined by the data voltage plus the threshold voltage of the drive transistor 12. At this point, the charges stored on parasitic capacitances 42 and 52 can migrate to the first capacitive device 32, thus corrupting the voltage threshold measurement result, which can lead to the aforementioned unwanted visible artefacts in the output of the display device.

Inter alia, it is an object of the present invention to provide an improved display device of the kind described in the opening paragraph.

It is another object of the present invention to provide a display device comprising a plurality of pixels having capacitive devices for controlling the current mode of a drive transistor with a reduced sensitivity to disruptive parasitic capacitances.

According to an aspect of the invention, there is provided a display device comprising a plurality of pixels carried on a substrate, each pixel comprising a current-driven display element coupled between a first conductive layer and an second conductive layer, the second conductive layer being coupled to a current supply via a switchable device having a thin film component on a first area of the substrate; a first capacitive device having a first capacitor plate on a second area of the substrate, the first capacitor plate being conductively coupled to the thin film component; a second capacitor plate overlaying the first capacitor plate; and a first insulating layer between the first capacitor plate and the second capacitor plate; each pixel further comprising a second capacitive device sharing the second capacitor plate of the first capacitive device, the second capacitive device further comprising a third capacitor plate overlaying the second capacitor plate, the third capacitor plate comprising at least a part of the second conductive layer, and a second insulating layer between the second capacitor plate and the third capacitor plate.

By stacking the first capacitive device and the second capacitive device on top of each other rather than arranging them laterally next to each other, the individual capacitances of these capacitive devices can be significantly increased, because the capacitive devices do not have to divide an available substrate surface area between them, which would limit the individual capacitance of the capacitive devices. Consequently, a parasitic capacitance between a component of the pixel and one of the capacitive devices has a smaller impact on the data stored on the capacitive device involved, due to the fact that the capacitive device involved has a larger capacitance, and hence the amount of parasitic charge will represent a smaller fraction of the total charge of the capacitive device involved, thus causing a smaller disruption to the data stored on the capacitive device involved.

In an embodiment, the first insulating layer is of a different thickness to the second insulating layer. The use of different thicknesses for the first insulating layer and the second insulating layer, the dielectric permittivity of these layers and hence the respective capacitances of the first and second capacitive devices can be tuned to the specific requirements of their functionality.

Advantageously, the first insulating layer has a first thickness over the first capacitor plate and a second thickness over the thin film component, the first thickness being thinner than the second thickness. Normally, the insulating layer between the thin film component and the channel structure of the switchable device would also be used to provide the insulating layer between the capacitor plates of an associated capacitive device. However, by using a thinner layer for the first capacitive device, the capacitance of this capacitive device can be further increased, thus increasing the robustness of the first capacitive device against parasitic capacitances, or the amount of substrate surface area covered by the capacitive device can be reduced, thus improving the aperture characteristics of the pixels in case of a display device employing light emission through the substrate.

Alternatively, the first insulating layer may comprise a first material and the second insulating layer may comprise a second material; the first and second materials having different dielectric permittivities. Instead of just varying the thickness of the first and second insulating layers to tune the capacitances of the first and second capacitive devices, different materials with different dielectric permittivities can be chosen for the first and second insulating layers to tune the capacitances of the first and second capacitive devices.

It is an advantage if the first capacitor plate has a conductive coupling to a further switchable device, the conductive coupling extending through the first insulating layer, each pixel further comprising a conductive layer covering a part of the second insulating layer that is oriented over the conductive coupling for reducing a capacitance between the conductive coupling and the first conductive layer line. Such a further switchable device can for instance be the transistor 14 of FIG. 2, which can be conductively coupled to the first capacitive device using a via. To prevent the occurrence of parasitic capacitances between the conductive coupling and the first conductive layer of the pixel, the conductive coupling is shielded from the first conductive layer by an additional conductive layer like a transparent Indium Tin Oxide (ITO) pad extending over the conductive coupling, thus reducing the amount of parasitic capacitances influencing the first capacitive device.

Preferably, the second conductive layer does not extend over the thin film component. This reduces the amount of parasitic capacitance between the thin film component and the second conductive layer, which improves the controllability of the thin film component with the voltages stored across the first and second capacitive devices.

The invention is described in more detail and by way of non-limiting examples with reference to the accompanying drawings, wherein:

FIG. 1 schematically depicts a display device having a plurality of pixels;

FIGS. 2 and 3 schematically depict prior art pixels;

It should be understood that the Figures are merely schematic and are not drawn to scale. It should also be understood that the same reference numerals are used throughout the Figures to indicate the same or similar parts.

The present invention will be explained using the pixel in FIG. 2. It is, however, emphasized that this is done by way of non-limiting example only; any pixel having two capacitive devices in series between the gate and source or drain of a drive transistor can benefit from the teachings of the present invention.

Figure 1:
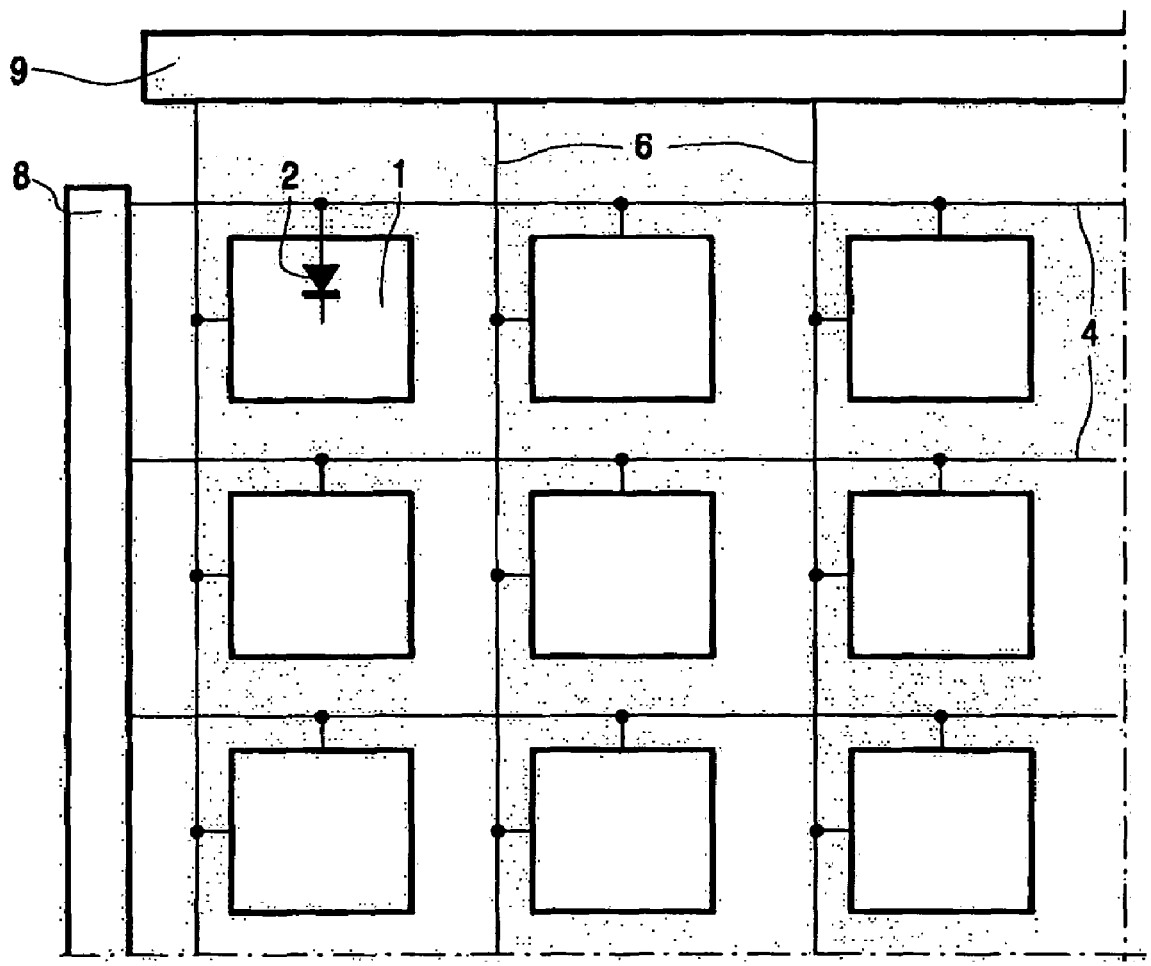
Figure 4:
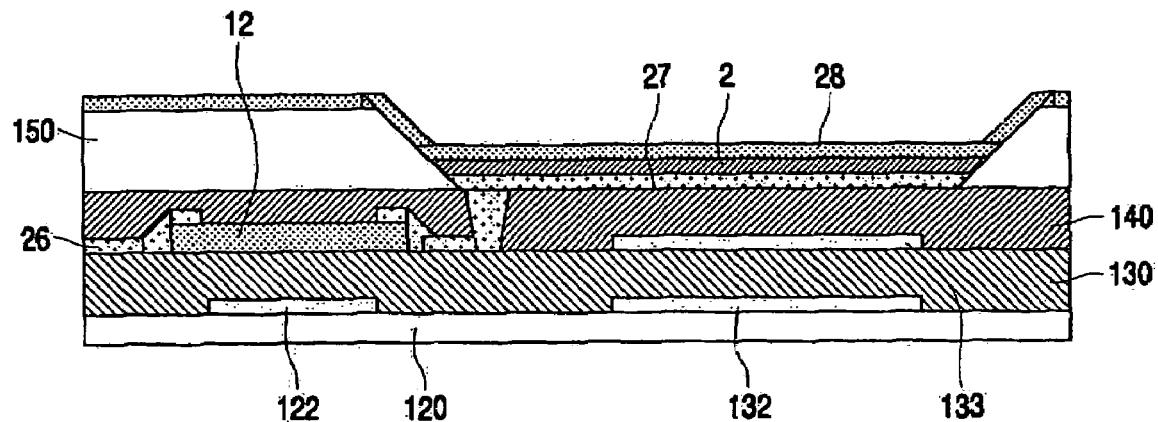
FIG. 4 shows a cross-section of an embodiment of a pixel of the display device of the present invention.

In FIG. 4, a pixel is shown having a current-driven display element 2 coupled between a first conductive layer 28 and a second conductive layer 27. The first conductive layer 28 acts as a cathode and the second conductive layer 27 acts as an anode to the display element 2, although it is emphasized that the layer functionalities may be reversed if appropriate. The current-driven display element 2 may comprise any known LED material, like a known OLED or poly-LED material. The drive transistor 12 has a thin film component 122, which may be the gate of the drive transistor 12, covering a first area of substrate 120, with the switchable device 12, which may be the a-Si drive transistor 12 from FIG. 1, being coupled between current supply line 26 and the second conductive layer 27. A first capacitive device, which may be the first capacitive device 32 from FIG. 2, is formed by a first capacitor plate 132 and a second capacitor plate 133, with a first insulating material layer 130 having a first dielectric permittivity in between the two plates. The first capacitor plate 132, which is conductively coupled to the thin film component 122 by a conductive coupling (not shown), typically will be realized in the same conductive material deposition step as the thin film component 122. The conductive coupling between the first capacitor plate 132 and the thin film component 122 can be realized in this deposition step as well. The first insulating layer 130 is typically deposited in a following processing step, and covers both the thin film component 122 as well as the first capacitor plate 132. The first insulating layer 130 may be a silicon nitride (SiN) layer, or may be of another known insulating material. The second capacitor plate 133 typically is formed by a conductive material deposition and patterning on top of the first insulating layer 130. This conductive material may be deposited in the same step as the conductive column material used for implementing data line 24 from FIG. 2, in case of a matrix array display device having rows and columns for addressing the various pixels. The conductive materials may be any suitable conductive material, like a metal.

Figure 2:
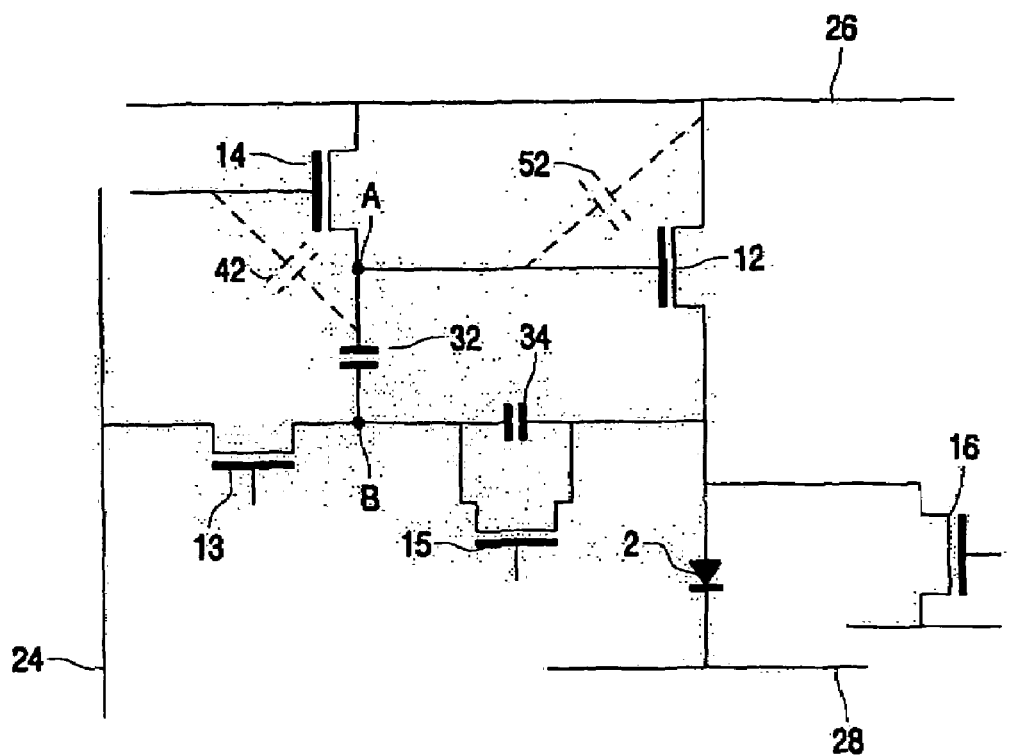
Figure 3:
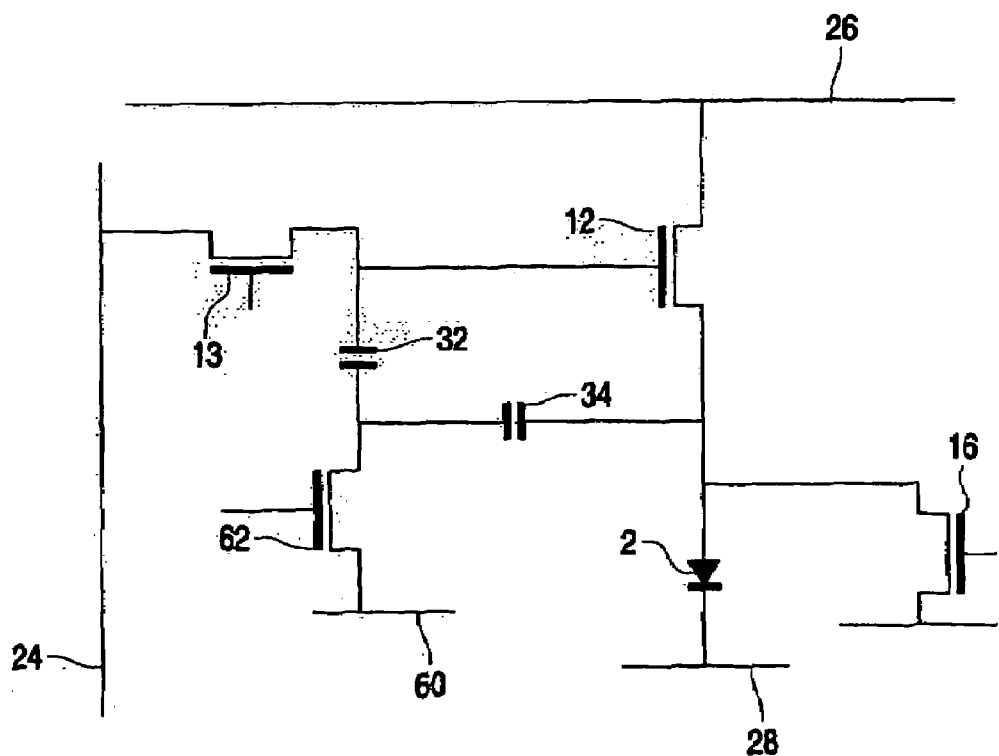

The second capacitive device, which may be the second capacitive device 34 from FIG. 2, is stacked on top of the first capacitive device, and is formed by sharing the second capacitor plate 133 of the first capacitive device, and by a third capacitor plate including at least a part of the second conductive layer 27. The second and third capacitor plate are separated by a second insulating layer 140 having a second dielectric permittivity. The main advantage of stacking the first and second capacitive device on top of each other rather than realizing them next to each other in the same layer of the pixel is that, consequently, the capacitance of these devices can be significantly increased. The capacitance C of a capacitive device can be expressed by the equation $C=\in A/d$, with $\in$ being the dielectric permittivity of the insulating material in between the plates, A being the plate area and d being the distance between the plates. The stacking of the two capacitive devices allows for an increase of the area of the capacitor plates 132 and 133, thus leading to an increased capacitance for the capacitive devices. In the case of a top-emission pixel, the light emitted by the current-driven display element 2 does not have to pass through the substrate, so the capacitor plates can be sized to cover substantially all the substrate area that is left uncovered by the other circuit elements of the pixel.

The larger capacitance makes the capacitive devices more robust against the influence of parasitic capacitances, such as the capacitance between the conductive layer including the first capacitor plate 132 and the current source line 26, which is the parasitic capacitance 52 from FIG. 2. The influence of the parasitic capacitances on the threshold voltage can be expressed by the following formula:

$$\Delta V = (C_{42}+C_{52})^* V_{th}/(C_{32}+C_{42}+C_{52})$$

with $\Delta V$ being the variation in $V_{th}$ caused by the influence of the capacitances $C_{42}$ and $C_{52}$ of the parasitic capacitances 42 and 52 respectively on the capacitance $C_{32}$ of the first capacitive device. This expression clearly shows that the capacitance ratio between $C_{32}$ on the one hand and $C_{42}$ and $C_{52}$ on the other hand should be maximized to minimize the impact of the parasitic capacitances on $V_{th}$.

It may be desirable to have a stacked capacitor structure as shown in FIG. 4 in which one of the two capacitive devices has a larger capacitance than the other. This can be achieved by choosing different materials with different dielectric permittivities for the first insulating layer 130 and the second insulating layer 140. For instance, the first insulating layer 130 may be a SiN layer having a relatively high dielectric permittivity and the second insulating layer 140 may be a polymer layer having a relatively low dielectric permittivity, thus giving the first capacitive device a higher capacitance than the second capacitive device. Obviously, depending on circuit requirements, the layers may also be reversed, giving the second capacitance device a larger capacitance than the first capacitive device.

Different capacitances for the first capacitive device and the second capacitive device can also be achieved by choosing different distances between the first capacitor plate 132 and the second capacitor plate 133 and between the second capacitor plate 133 and the second conductive layer 27 respectively. This can be realized by depositing a first insulating layer 130 at a first thickness and a second insulating layer 140 at a second thickness. The insulating layers 130 and 140 may be of the same material, or may be composed of different materials.

Figure 5:
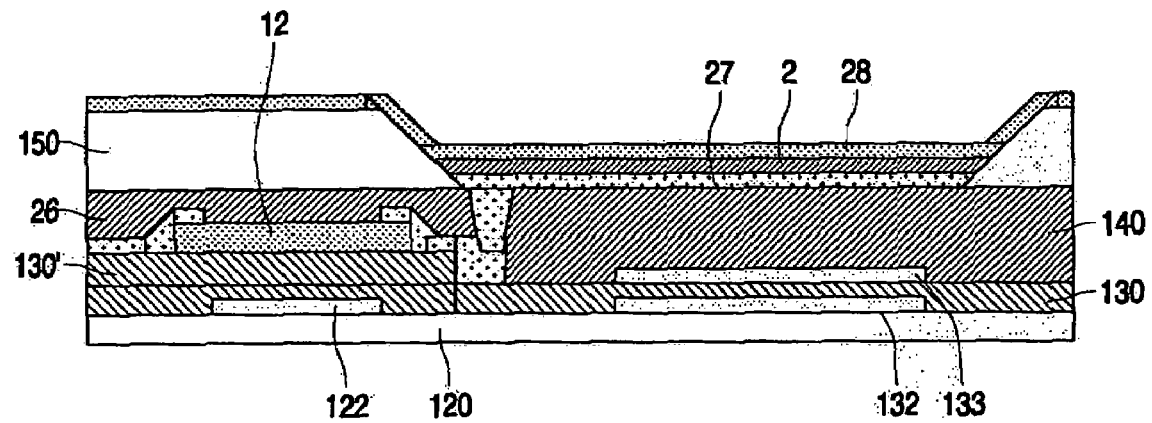
FIG. 5 shows a cross-section of another embodiment of a pixel of the display device of the present invention.

A modified embodiment using different thicknesses for the first insulating layer 130 and the second insulating layer 140 to achieve a first capacitive device with a different capacitance to the second capacitive device is shown in FIG. 5. The first insulating layer 130 has two different thicknesses; a first thickness between the first capacitor plate 132 and the second capacitor plate 133, which is kept very thin, and a second thickness between the thin film component 122 and the switchable device 12. The second thickness preferably corresponds to a typical thickness for the dielectric between the gate and the semiconductor material of a TFT like switchable device 12, e.g., 0.33 micron. This can for instance be achieved by first depositing a layer of first insulating material having the first thickness, in which the holes for the thin film component 122 and the first capacitor plate 132 are patterned in a subsequent step. The completion of these structures is followed by the deposition of the insulating layer 130' to increase the layer over the thin film component 122 to the intended second thickness. This process guarantees that the thin part of the first insulating layer 130 does not have to cross the edges of any metal features, which would cause a deterioration of the performance of the first capacitive device. However, it may be advantageous to apply thicker insulating layers to other parts of the pixels, for instance to ensure sufficient step coverage of the metal lines (not shown) of the pixel.

The main advantage of using a very thin dielectric layer between the first capacitor plate 132 and the second capacitor plate 133 is that a large capacitance for the first capacitive device can be achieved without having to extend the area of the first capacitor plate 132 and the second capacitor plate 133 over a large part of the substrate 120. This is particularly advantageous for bottom-emission display devices, which emit light through the substrate 120. Reducing the area of the capacitor plates 132 and 133 increases the aperture of the pixel, which leads to an improved light emission yield through the substrate 120 for bottom-emission display devices.

At this point, it is emphasized that in order to further improve the capacitance ratio between the first and second capacitive devices on the one hand and the parasitic capacitances on the other hand, it is beneficial to limit the presence of parasitic capacitances in the pixels shown in FIGS. 4 and 5. To this end, the insulating layer 150 covering the switchable device 12 is made as thick as practically possible, to avoid the presence of any significant parasitic capacitance between the first conductive layer 28 and the thin film component 122 of the switchable device 12. The insulating layer 150 may be any known suitable insulating layer, like a polymer layer, a silicon nitride or a silicon oxide layer. For the same reason, the second conductive layer 27 should not be laterally extended over the thin film component 122 of the switchable device 12, because such an extension could also give rise to a substantial parasitic capacitance between the second conductive layer 27 and the thin film component 122 of the switchable device 12.

Figure 6:
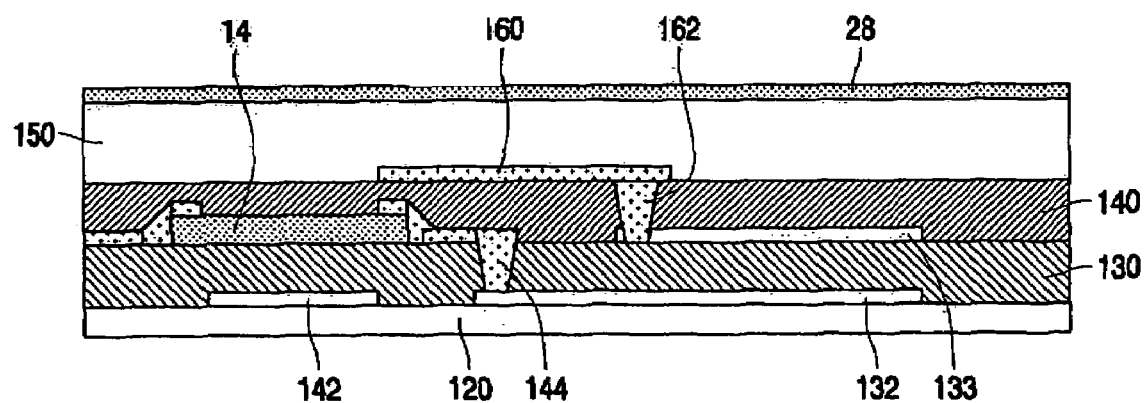
FIG. 6 shows another cross-section of a pixel of the display device of the present invention.

FIG. 6 shows a cross-section of another pixel according to the present invention, in which a further measure to limit the impact of parasitic capacitances is included. The cross-section in FIG. 6, in which the display device 2 is not visible, shows the stacked capacitive device structure of the present invention having a conductive coupling 144, e.g., a via, extending through the first insulating layer 130 from the first capacitor plate 132 of the first capacitive device to a further switchable device 14. The further switchable device 14, which may be the TFT 14 from FIG. 2, also has a thin film component 142 on the substrate 120. The thin film component 142 may be the gate of the further switchable device 14. The conductive coupling 144 forms a part of the capacitance of the first capacitive device, but because it extends through the first insulating layer 130, the conductive coupling 144 is likely to give rise to a larger parasitic capacitance with the first conductive layer 28 than the first capacitor plate 132, which is further away from the first conductive layer 28.

To reduce this unwanted parasitic capacitance, the conductive coupling 144 is shielded from the first conductive layer 28 by a conductive layer 160 covering at least a part of the second insulating layer 140. The conductive layer 160 is conductively coupled to the second capacitor plate 133 through a conductive coupling 162, e.g., a via. The conductive layer 160 may be realized using ITO as the conductive material, which has the advantage that for bottom-emission devices, the aperture of the pixel is not adversely affected, although other conductive materials, especially in the case of top-emission display devices, may be used as well.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A display device comprising a plurality of pixels carried on a substrate, each pixel comprising:
   a current-driven display element coupled between a first conductive layer and a second conductive layer, the second conductive layer being coupled to a current supply via a switchable device having a thin film component on a first area of the substrate and the second conductive layer not extending over the thin film component;
   a first capacitive device comprising:
   a first capacitor plate in contact with a second area of the substrate, the first capacitor plate being conductively coupled to the thin film component;
   a second capacitor plate overlaying the first capacitor plate; and
   a first insulating layer between the first capacitor plate and the second capacitor plate and disposed in the switchable device for insulating the thin film component;
   each pixel further comprising:
   a second capacitive device sharing the second capacitor plate of the first capacitive device, the second capacitive device further comprising a third capacitor plate overlaying the second capacitor plate, the third capacitor plate comprising at least a part of the second conductive layer, and a second insulating layer between the second capacitor plate and the third capacitor plate.

2. The display device as claimed in claim 1, wherein the first insulating layer is of a different thickness to the second insulating layer.

3. The display device as claimed in claim 1, wherein the first insulating layer has a first thickness over the first capacitor plate and a second thickness over the thin film component, the first thickness being thinner than the second thickness.

4. The display device as claimed in claim 1, wherein the first insulating layer comprises a first material and the second insulating layer comprises a second material; the first and second materials having different dielectric permittivities.

5. The display device as claimed in claim 1, wherein the first capacitor plate has a conductive coupling to a further switchable device, the conductive coupling extending through the first insulating layer, each pixel further comprising a conductive layer covering a part of the second insulating layer that is oriented over the conductive coupling for reducing a capacitance between the conductive coupling and the first conductive layer.

6. The display device as claimed in claim 1, wherein the first capacitor plate and the second capacitor plate are of substantially equal length.

7. The display device as claimed in claim 1, further comprising a third insulating layer that does not extend below the second conductive layer.

8. The display device as claimed in claim 1, further comprising a third insulating layer in contact with the first conductive layer and the second conductive layer.

* * * * *